(12) United States Patent
Toth et al.

(10) Patent No.: US 8,921,811 B2
(45) Date of Patent: Dec. 30, 2014

(54) HIGH PRESSURE CHARGED PARTICLE BEAM SYSTEM

(75) Inventors: Milos Toth, Portland, OR (US); William Ralph Knowles, Hillsboro, OR (US); Rae Knowles, legal representative, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 420 days.

(21) Appl. No.: 12/525,908

(22) PCT Filed: Feb. 6, 2008

(86) PCT No.: PCT/US2008/053223
§ 371 (c)(1),
(2), (4) Date: Dec. 9, 2009

(87) PCT Pub. No.: WO2008/098084
PCT Pub. Date: Aug. 14, 2008

(65) Prior Publication Data
US 2011/0031394 A1 Feb. 10, 2011

Related U.S. Application Data

(60) Provisional application No. 60/900,028, filed on Feb. 6, 2007.

(51) Int. Cl.
*G01N 23/00* (2006.01)
*H01J 37/305* (2006.01)
*H01J 37/301* (2006.01)

(52) U.S. Cl.
CPC .......... *H01J 37/3056* (2013.01); *H01J 37/301* (2013.01); *H01J 2237/006* (2013.01); *H01J 2237/188* (2013.01); *H01J 2237/2003* (2013.01); *H01J 2237/2605* (2013.01); *H01J 2237/31732* (2013.01); *H01J 2237/3174* (2013.01)
USPC .................. 250/492.1; 250/492.2; 250/492.3; 250/491.1

(58) Field of Classification Search
None
See application file for complete search history.

(56) References Cited

U.S. PATENT DOCUMENTS 4,241,259 A   12/1980   Feuerbaum et al.
4,605,566 A * 8/1986   Matsui et al. ................. 438/535

(Continued)

FOREIGN PATENT DOCUMENTS

EP   1693879   8/2006
EP   1724809   11/2006

(Continued)

OTHER PUBLICATIONS

Bouldin, C.E., et al., 'Conversion-Electron Extended X-Ray-Absorption Fine-Structure Measurements of Ion Damaged GaAs,' Physical Review B, Jan. 15, 1987, pp. 1429-1432, vol. 35, No. 3.

(Continued)

*Primary Examiner* — Andrew Smyth
(74) *Attorney, Agent, or Firm* — Scheinberg & Associates, PC; Michael O. Scheinberg (57) ABSTRACT

The current invention includes methods and apparatuses for processing, that is, altering and imaging, a sample in a high pressure charged particle beam system. Embodiments of the invention include a cell in which the sample is positioned during high pressure charged particle beam processing. The cell reduces the amount of gas required for processing, thereby allowing rapid introduction, exhaustion, and switching between gases and between processing and imaging modes. Maintaining the processes gases within the cell protects the sample chamber and column from contact with the gases. In some embodiments, the temperature of the cell walls and the sample can be controlled.

18 Claims, 7 Drawing Sheets

(56) References Cited

U.S. PATENT DOCUMENTS

| | | | |
|---|---|---|---|
| 4,785,182 A | | 11/1988 | Mancuso et al. |
| 4,823,006 A | | 4/1989 | Danilatos et al. |
| 4,897,545 A | | 1/1990 | Danilatos |
| 5,250,808 A | | 10/1993 | Danilatos et al. |
| 5,342,448 A | * | 8/1994 | Hamamura et al. ..... 118/723 FI |
| 5,362,964 A | | 11/1994 | Knowles et al. |
| 5,397,956 A | * | 3/1995 | Araki et al. ............. 313/231.31 |
| 5,412,211 A | * | 5/1995 | Knowles ....................... 250/310 |
| 5,440,124 A | * | 8/1995 | Kelly et al. .................... 850/63 |
| 5,493,125 A | * | 2/1996 | Okayama et al. ........ 250/441.11 |
| 5,523,577 A | * | 6/1996 | Schonberg et al. ........ 250/492.3 |
| 5,563,411 A | | 10/1996 | Kawata et al. |
| 5,683,547 A | * | 11/1997 | Azuma et al. ................. 438/695 |
| 5,828,064 A | | 10/1998 | Knowles |
| 5,945,672 A | | 8/1999 | Knowles et al. |
| 6,025,592 A | | 2/2000 | Knowles et al. |
| 6,303,932 B1 | | 10/2001 | Hamamura et al. |
| 6,365,898 B1 | | 4/2002 | Sudraud et al. |
| 6,440,615 B1 | * | 8/2002 | Shimizu ........................... 430/5 |
| 6,674,076 B1 | * | 1/2004 | Orfino et al. ..................... 850/9 |
| 6,686,590 B2 | | 2/2004 | Ogawa |
| 6,753,538 B2 | | 6/2004 | Musil et al. |
| 6,809,322 B2 | * | 10/2004 | Danilatos ................. 250/441.11 |
| 6,936,817 B2 | | 8/2005 | Feuerbaum |
| 6,972,412 B2 | * | 12/2005 | Scholtz et al. ............ 250/396 R |
| 6,979,822 B1 | * | 12/2005 | Stewart et al. ................. 250/310 |
| 7,241,993 B2 | | 7/2007 | Nakasuji et al. |
| 7,304,302 B1 | * | 12/2007 | Nunan et al. ................... 250/311 |
| 7,374,701 B2 | | 5/2008 | Hwang et al. |
| 7,411,191 B2 | | 8/2008 | Nakasuji et al. |
| 7,456,413 B2 | | 11/2008 | Buijsse et al. |
| 7,482,603 B2 | | 1/2009 | Tomimatsu et al. |
| 7,989,782 B2 | | 8/2011 | Tomimatsu et al. |
| 8,053,726 B2 | | 11/2011 | Nakasuji et al. |
| 2004/0124356 A1 | * | 7/2004 | Scholtz et al. ................. 250/310 |
| 2005/0000937 A1 | | 1/2005 | Chiang et al. |
| 2005/0011457 A1 | | 1/2005 | Chiang et al. |
| 2005/0178966 A1 | | 8/2005 | Gross |
| 2006/0011834 A1 | * | 1/2006 | Nishimura et al. ............ 250/310 |
| 2006/0046042 A1 | * | 3/2006 | Drzal et al. ................. 428/292.1 |
| 2006/0228634 A1 | * | 10/2006 | Bret et al. ......................... 430/5 |
| 2006/0249677 A1 | | 11/2006 | Chao et al. |
| 2007/0176102 A1 | * | 8/2007 | Slingerland et al. .......... 250/310 |
| 2008/0185509 A1 | | 8/2008 | Knowles |
| 2008/0265159 A1 | | 10/2008 | Hatakeyama et al. |
| 2008/0308729 A1 | | 12/2008 | Kimba et al. |
| 2008/0308742 A1 | | 12/2008 | Gerlach et al. |
| 2009/0152460 A1 | | 6/2009 | Buhler et al. |
| 2009/0166557 A1 | | 7/2009 | Makino et al. |
| 2010/0133433 A1 | | 6/2010 | Tanimoto et al. |
| 2011/0006205 A1 | | 1/2011 | Browning |

FOREIGN PATENT DOCUMENTS

| | | | | |
|---|---|---|---|---|
| GB | 2186737 | | 8/1987 | |
| GB | 2186737 A | * | 8/1987 | .............. H01J 37/28 |
| JP | 62-1358 | | 1/1987 | |
| JP | 63-65952 | | 4/1988 | |
| JP | 3-273134 | | 12/1991 | |
| JP | 03273134 A | * | 12/1991 | .............. G01N 3/18 |
| JP | 9-63527 | | 3/1997 | |
| JP | 10172487 A | * | 6/1998 | .............. H01J 37/20 |
| JP | 2002214091 | | 7/2002 | |
| JP | 2002289129 A | * | 10/2002 | .............. H01J 37/28 |
| JP | 2003308801 | | 10/2003 | |
| JP | 2005174591 | | 6/2005 | |
| JP | 2005190864 | | 7/2005 | |
| JP | 2006100038 | | 4/2006 | |
| WO | 2004-064098 | | 7/2004 | |
| WO | 2008098084 | | 8/2008 | |

OTHER PUBLICATIONS

Elam, W.T., et al., 'Depth Dependence for Extended X-Ray-Absorption Fine-Structure Spectropscopy Detected via Electron Yield in He and In Vacuum,' Physical Review B, Jul. 1, 1988, pp. 26-30, vol. 38, No. 1.

Honda, Masato, et al., 'Atmospheric Effect of Air, N2, O2, and Water Vapor on the Ionization Energy of Titanyl Phthalocyanine Thin Film Studied by Photoemission Yield Spectroscopy,' Journal of Applied Physics, 2007, 10 pgs., vol. 102.

Kordesch, M.E., et al., 'Electron-Yield Extended X-Ray Absorption Fine Structure with the use of a Gas-Flow Electron Detector,' Physical Review B, Jan. 1, 1984, pp. 491-492, vol. 29, No. 1.

Long, G.G., et al., 'Surface-Extended X-Ray-Absorption Fine-Structure Experiments at Atmospheric Pressure by means of a Photocathode Proportional Counter with Monolayer Sensitivity,' Physical Review B, May 15, 1989, pp. 10651-10657, vol. 39, No. 15.

Japanese Office Action dated Nov. 14, 2012, 6 pages.

Sung, Myung, M., et al., 'Chemical-Beam Deposition of GaN Films on Si(111) from Diethylazidogallium Methylhydrazine Adduct,' J. Vac. Sci. Technol. A, Mau/Jun. 2004, pp. 461-464, vol. 22, Iss. 3.

Boyes, E.D., et al., "Environmental high resolution electron microscopy and applications to chemical science," Ultramicroscopy, 1997, pp. 219-232, vol. 67.

Folch, Albert, et al., "High-vacuum versus 'environmental' electron beam deposition," J. Vac. Sci. Technol. B, Jul./Aug. 1996, pp. 2609-2614, vol. 14, No. 4.

* cited by examiner

HIGH PRESSURE CHARGED PARTICLE BEAM SYSTEM

TECHNICAL FIELD OF THE INVENTION

The present invention relates to charged particle beam systems and more particularly to electron microscopes in which the sample environment is at a relatively high pressure.

BACKGROUND OF THE INVENTION

In a scanning electron microscope ("SEM"), a primary beam of electrons is scanned onto a region of a sample that is to be investigated. The energy released in the impact of the electrons with the sample causes the liberation of other charged particles in the sample. The quantity and energy of these secondary particles provide information on the nature, structure and composition of the sample. The term "secondary electron" as used herein includes backscattered primary electrons, as well as electrons originating from the sample. To detect secondary particles, a SEM is often provided with one or more secondary electron detectors. The term "sample" is traditionally used to indicate any work piece being processed or observed in a charged particle beam system and the term as used herein includes any work piece and is not limited to a sample that is being used as a representative of a larger population.

In a conventional SEM, the sample is maintained in a high vacuum to prevent scattering of the primary electron beam by gas molecules and to permit collection of the secondary electrons. However, wet samples such as biological specimens are not suitable for observation in a high vacuum. Such samples experience evaporation of their fluid content in the vacuum before an accurate image can be obtained, and the evaporated gas interferes with the primary electron beam. Objects that outgas, that is, solids that lose gas at high vacuum, also require special consideration.

Electron microscopes that operate with the sample under a relatively high pressure are described, for example, in U.S. Pat. No. 4,785,182 to Mancuso et al., entitled "Secondary Electron Detector for Use in a Gaseous Atmosphere." Such devices are better known as High Pressure Scanning Electron Microscopes (HPSEM) or Environmental Scanning Electron Microscopes. An example is the Quanta 600 ESEM® high pressure SEM from FEI Company.

In an HPSEM, the sample that is to be investigated is placed in an atmosphere of a gas having a pressure typically between 0.1 Torr (0.13 mbar) and 50 Torr (65 mbar), and more typically between 1 Torr (1.3 mbar) and 10 Torr (13 mbar) whereas in a conventional SEM the sample is located in vacuum of substantially lower pressure, typically less than $10^{-5}$ Torr ($1.3 \times 10^{-5}$ mbar). The advantage of an HPSEM as compared to a conventional SEM is that the HPSEM offers the possibility of forming electron-optical images of moist samples, such as biological samples, and other samples which, under the high vacuum conditions in a conventional SEM, would be difficult to image. An HPSEM provides the possibility of maintaining the sample in its natural state; the sample is not subjected to the disadvantageous requirements of drying, freezing or vacuum coating, which are normally necessary in studies using conventional SEMs. Another advantage of an HPSEM is that the ionized imaging gas facilitates neutralization of electrical charges that tend to build up on insulating samples, such as plastics, ceramics or glasses.

In an HPSEM, secondary electrons are typically detected using a process known as "gas amplification," in which the secondary charged particles are accelerated by an electric field and collide with gas molecules in an imaging gas to create additional charged particles, which in turn collide with other gas molecules to produce still additional charged particles. This cascade continues until a greatly increased number of charged particles are detected as an electrical current at a detector electrode. In some embodiments, each secondary electron from the sample surface generates, for example, more than 20, more than 100, or more than 1,000 additional electrons, depending upon the gas pressure and the electrode configuration.

HPSEM limit the region of high gas pressure to a sample chamber by using a pressure-limiting aperture (PLA) to maintain a high vacuum in the focusing column. Gas molecules scatter the primary electron beam, and so the pressure limiting aperture is positioned to minimize the distance that the electron beam travels in the high pressure region to reduce interference with the primary beam, while providing a sufficient travel distance for adequate gas amplification of the secondary electron signal.

An HPSEM as described in U.S. Pat. No. 4,785,182 comprises a vacuum envelope having a pressure limiting aperture, an electron beam source located within the vacuum envelope and capable of emitting electrons, focusing lens located within the vacuum envelope and capable of directing an electron beam emitted by the electron beam source through the pressure limiting aperture, beam deflectors located within the vacuum envelope and capable of scanning the electron beam, and a sample chamber including a sample platform disposed outside the high vacuum envelope and capable of maintaining a sample enveloped in a gas at a desired pressure.

While an HPSEM can observe moist biological sample, problems still exist with such observations. For example, when hydrated materials are observed at room or body temperature, water tends to condense on all surfaces within the sample chamber. Such condensation can interfere with the operation of HPSEM, as well as cause corrosion and contamination.

Charged particle beams, such as electron beams or ion beams, can also be used to induce a chemical reaction to etch a sample or to deposit material onto a sample. Such processes are described, for example, in U.S. Pat. No. 6,753,538 to Mucil et al. for "Electron Beam Processing." The process of a charged particle beam interacting with a process gas in the presence of a substrate to produce a chemical reaction is referred to as "beam chemistry." The term "processing" as used herein includes both processing that alters the sample surface, such as etching and deposition, as well as imaging. The term "processing gas" is used to include a gas that is used for imaging or a gas that is used together with the charged particle beam to alter the sample. The term "imaging gas" is used to include a gas that is used for imaging. The classes of gasses are not mutually exclusive, and some gases may be used for both altering the sample and for forming an image. For example, water vapor can be used to etch a sample that includes carbon and can be used to form an image of samples that include other materials.

Conventional HPSEMs are not well adapted for efficient beam chemistry. One problem with using a HPSEM system for beam chemistry is the considerable time required to introduce and evacuate gases from the sample chamber. The sample chamber in a conventional HPSEM includes a gas inlet through which a gas is introduced through a leak valve. The gas then migrates throughout the sample chamber. Some of the gas molecules escape through the PLA into the column, where they are removed by a vacuum pump that maintains the column at a low pressure. The inlet leak valve is adjusted so that a desired equilibrium pressure is achieved, with the gas escaping through the PLA into the column just matching the gas introduced through the leak valve. The HPSEM typically begins processing a sample only after equilibrium is achieved. It takes a considerable amount of time for the gas to reach an equilibrium pressure, particularly if the vapor pressure of the beam chemistry precursor is similar to the desired operating pressure of the sample chamber. For a large sample chamber volume of 30 liters, such as that used in a typical dual-beam system, it can take up to 30 minutes for the partial pressure of the process gas to reach equilibrium.

This problem is compounded when a process entails injecting multiple process gases into the sample chamber. Typically, there is a pressure gauge downstream of the needle valve on the chamber side. The pressure gauge measures the total pressure in the sample chamber and is incapable of separately measuring the partial pressures of multiple process gases in a mixture. Thus, it is difficult to know when the desired partial pressure of each of the gases has been achieved.

When performing beam chemistry processing in a conventional SEM, FIB, or dual beam system, the system operator will typically obtain a charged particle beam image of the sample to navigate to an area that is to be processed by etching or depositing material. After performing the beam processing operation, the operator will typically obtain another charged particle beam image of the sample to evaluate the results of the process. Because different gases are typically used to process and image in an HPSEM, the sequence of image, process, and image would require multiple changes of the gas in the chamber. If some process gas remains in the chamber during imaging, the sample may be unintentionally modified by the beam during the imaging operation. Because of the considerable time required to fully evacuate one gas and then to reach equilibrium pressure with another gas, such multiple step operations are not practical in an HPSEM. The time is further increased in some cases because the molecules of some gases used in beam chemistry tend to have very long adsorption times on the vacuum chamber walls, and take longer to fully evaporate.

GB2186737 to Shah describes a specimen chamber for use in a scanning electron beam instrument. A sample sits atop a specimen support including a moisture absorbing pad. An inlet duct connected to a source of ambient gas brings moisture from the pad into the chamber to keep the sample from drying out. An electrode positioned close to the sample allows charged carriers of either sign to be removed from the chamber to improve contrast of an image derived from current detected at the specimen support.

Another reason why HPSEMs are not generally used for beam chemistry is that corrosive process gases can degrade the HPSEM components. For example, certain process gases associated with beam chemistry can react spontaneously with plastic tubing and are very dangerous to human health. A gas like $XeF_2$ can make plastic gas tubing brittle and eventually cause leaks of dangerous gases into the surrounding environment.

SUMMARY OF THE INVENTION

An object of the invention is to facilitate charged particle beam processing in a high pressure charged particle beam system.

The current invention includes methods and apparatuses for processing, that is, altering and imaging, a sample in a high pressure charged particle beam system.

Embodiments of the invention include a cell in which the sample is positioned during high pressure charged particle beam processing. The cell reduces the amount of gas required for processing, thereby allowing rapid introduction, exhaustion, and switching between gases and between processing and imaging modes. Some embodiments include one or more gas inlets and a gas outlet connected to further facilitate rapid introduction, exhaustion, and switching between gases in the cell. Gas inlets may include one or more valves to rapidly select among multiple gas sources. In some embodiments, the cell is positioned within a sample chamber of a HPSEM. Maintaining the processes gases within the cell protects the sample chamber and column from contact with the gases. In some embodiments, the cell takes the place of the sample chamber. In some embodiments, the temperature of the cell walls and the sample can be controlled.

The foregoing has outlined rather broadly the features and technical advantages of embodiments of the present invention in order that the detailed description of the invention that follows may be better understood. Additional features and advantages of the invention will be described hereinafter. It should be appreciated by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Various embodiments can solve one or more of the problems associated with HPSEM systems for imaging and beam chemistry. There are several advantages to using an HPSEM for beam chemistry. Unlike high vacuum SEM beam chemistry processing in which the processing rate is limited by the rate at which the relatively low flux of precursor molecules arrives at the substrate, processing in an HSPEM at high electron fluxes is not so limited. Moreover, an HPSEM provides for charge neutralization during processing. With some process gases, the effect on the sample can be changed from etching to deposition by changing the primary beam current density. Moreover, the pressure at the sample can be measured unambiguously by measuring the cell background pressure.

Embodiments of the invention use a cell in which a sample is positioned for charged particle beam processing. The cell is typically positioned in a sample chamber of charged particle beam system, although the sample chamber itself can be constructed as a cell. A pressure limiting aperture maintains a lower pressure outside of the cell. A cell can be positioned inside a conventional high vacuum SEM chamber to provide the HPSEM processing capability, or the cell can be positioned inside an HPSEM sample chamber to provide a higher pressure capability and the capability to use corrosive gases.

The volume of the cell is typically significantly smaller than the volume of a typical prior art HPSEM sample chamber, thereby reducing the quantity of gas required to achieve a desired pressure for processing. Because the quantity of gas in the cell is relatively small, gas can be introduced, evacuated, and distributed within a cell more quickly than with a conventional sample chamber. Containing the gas within a cell protects the sample chamber and the electron focusing column from any adverse affects, such as corrosion, from processing gases, while the cell can be constructed from materials that will not be adversely affected by the gases. The cell protects the sample from any contamination in the sample chamber. A cell can be disposable, which can be advantageous when an extremely reactive gas is used.

In some embodiments, the cell includes a gas inlet and a gas outlet, the gas outlet communicating, directly or indirectly, to a vacuum pump. Unlike prior art HPSEMs in which the sample space is evacuated only through the PLA into the focusing column, embodiments that use a gas outlet in the cell provide for more rapid filing and evacuation of the cell. In some embodiments, a leak valve in line with the gas outlet allows gas to exit the cell during operation. The gas outlet thus provides an additional level of control over the gas flow through the chamber and the pressure in the chamber. The gas pressure and flow rate are not readily controllable in prior art HPSEM systems, by controlling the diameter of the PLA, because the diameter of the PLA is governed by, among other factors, the field of view and the beam scatter in the gas. Also in the prior art, the pressure in the sample chamber cannot always be readily controlled by controlling the flow into the chamber because the gas injection rate is limited by the vapor pressure of the precursor gas, and the consumption of the precursor gas is preferably limited in some applications because of the cost of the gas.

The pressure in the cell is a result of the flow rate into the cell through the gas inlet, the flow rate out of the cell through the gas outlet, and the leakage of gas through the PLA. A gas outlet connected to a vacuum pump can provide a gas flow rate that allows the gas to be changed rapidly and allows the system to rapidly reach equilibrium at a desired partial pressure of a newly introduced gas. In some embodiments, the gas outlet is preferably partly open while the beam is processing or imaging the sample, so that gas is flowing through the cell during beam processing. In other embodiments, there is no gas outlet, and the pressure in the cell is determined by the flow rate into the cell and the flow rate through the PLA.

The cell is preferably mounted on a movable platform so that the PLA that maintains a higher pressure in the cell can be aligned with the beam axis. The sample is preferably positioned on a moveable stage within the cell so that a region of interest on the sample can be positioned under the beam.

In some embodiments, a valve assembly connected to the gas inlet allows for selecting one or more of multiple gas sources to be supplied to the cell. In other embodiments, multiple gas inlets are provided into the cell, each gas inlet connected to one or more gas sources, so that gases can enter the cell separately and mix within the cell. Multiple gases can be selected simultaneously to fill the cell with a mixture of gases, or gases can be applied sequentially. For example, an imaging gas can be selected that provides gas amplification and charge neutralization, but that does not substantially alter the sample surface. A process gas can be selected that alters the sample by etching or deposition when activated by the charged particle beam. Some such processing gases also provide gas amplification for imaging, while other such process gases, under conditions of low pressure, provide only "blind" beam chemistry processing, that is, they do not provide sufficient gas amplification to produce a clear image. Multiple gas inlets are useful, for example, when an oxidizing gas is used to minimize the hydrocarbon content of electron beam-induced deposit. For example, a platinum deposition precursor such as methylcyclopentadienyl trimethyl platinum can be injected using one inlet, while a carbon etch precursor such as $O_2$, $H_2O$ or $N_2O$ can be injected using a second inlet. A flushing gas, such as nitrogen, can be selected to flush the cell to assist in the removal of sticky process gases. Examples of deposition precursors include tungsten hexcarbonyl, methylcyclopentadienyl trimethyl platinum, TEOS, TMOS, styrene and hexane. Etch precursors include chlorine, bromine, $XeF_2$, $O_2$, $H_2O$ and $N_2O$. Gases such as $N_2$ can be added to increase the total pressure and improve image quality and charge control.

There are many applications in which it is advantageous to use multiple gases simultaneously. For example, one gas can be used for beam chemistry deposition or etching, while a second gas is added to improve imaging. In some applications, one gas can be provided for etching, while another gas is provided simultaneously for deposition. An example of such an application is described below. A third gas can be added to the etching and deposition gas to improve imaging.

In some embodiments, the temperature of the cell walls can be controlled. In some embodiments, the temperature of the sample can be controlled. In some embodiments, the temperatures of both the cell walls and the sample can be controlled, and in some embodiments, the temperatures of the cell walls and the sample can be controlled independently. The temperature control of the cell walls and sample can entail heating or cooling. For example, a sample may be cooled to increases deposition rates, while a sample may be heated to increases the purity of the deposition.

The temperature of the cell walls and sample may also be varied to facilitate removal of sticky precursor gases after processing. For example, in some application, the cell walls are maintained at a higher temperature than the sample during etching, deposition, or imaging. After etching or deposition, the temperature of the cell walls can be further increased as gas is evacuated from the cell to desorb the gas molecules from the walls to facilitate rapid clean-up of the cell. The cell can also be flushed with a gas, such as nitrogen, while the walls and or sample are heated to further reduce the cleaning time by "scrubbing" the cell walls and the sample. The temperatures of the walls can then be returned to lower temperatures for subsequent processing. Scrubbing is particularly useful to remove precursor molecules that decompose spontaneously at low temperature, for example, 50 C.

When imaging or otherwise processing moist materials at room or body temperature, the moisture tends to condense on the cell walls. Heating the cell walls can prevent condensation of water vapor. Heating of the gas delivery lines can prevent blockage caused by condensation of precursor gases that require heating because of low room temperature vapor pressures. Some embodiments, therefore, provide a mechanism, such as a sleeve heated by a resistive coil or an outer jacket through which a warm or hot fluid flows.

In some embodiment, a second PLA outside the cell defines a region between the focusing column and the cell. The region may be a portion of the sample chamber, or it may be a separate region that allows for evacuation of process gasses that escape through the cell PLA, thereby reducing the amount of gas leaking into the focusing column to reduce aberration and corrosion of the column from chemically active gases.

Figure 1:
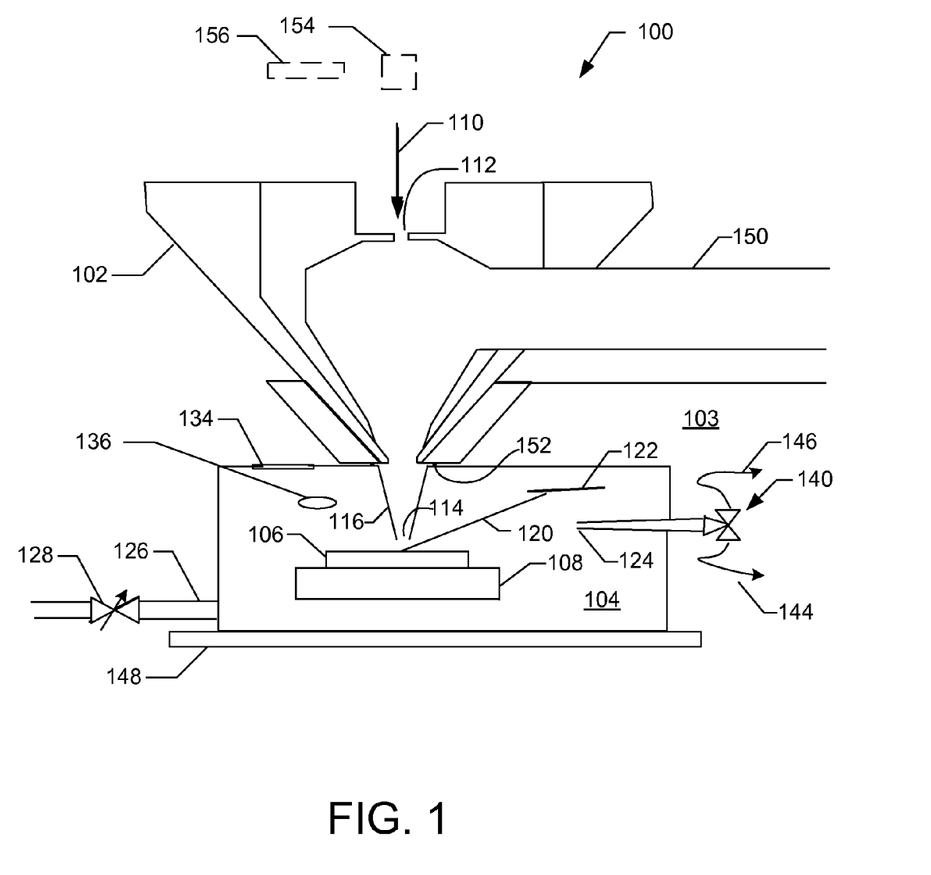
FIG. 1 shows a view of an embodiment of a particle-optical apparatus including a sample cell for use with a pinhole lens column.

FIG. 1 shows a cross-sectional view of a preferred embodiment of a particle-optical apparatus 100 comprising a pinhole magnetic objective lens 102, a sample chamber 103 having within it a sample cell 104 for maintaining a sample 106 at a relatively high pressure on a stage 108. A particle source (not shown) provides a primary electron beam 110 that passes through an upper PLA 112 and a lower PLA 114 at the bottom of a cone 116. PLA 114 preferably has a diameter of less than 500 μm to minimize gas leakage into the electron focusing column. Cone 116 reduces the path of the electron beam 110 through the gas in cell 104. Secondary electrons 120 emitted from the sample are detected by a secondary electron detector 122 built into cell 104 and positioned to enable detection inside cell 104.

Unlike GB GB2186737 describe above, this embodiment uses a detector 122 positioned apart from the specimen stage and does not use the stage current. The distance between detector 122 and the sample provides a sufficient electron path for collisions between electrons and the gas to significantly amplify the electron current. For example, there are typically more than 300 electrons, more than 500 electrons, or more than 1000 electrons reaching detector 122 for each electron leaving the sample. Detector 122 detects a current induced by the flow of charge in the gas cascade to form an image. In other embodiments, a photon detector can be used to detect photons emitted from the cascade to form an image. The photons are emitted by excited ions, fragments or neutrals, either in the gas or upon contact with surfaces inside the sample cell or the sample chamber.

A gas input 124 and a gas output 126 regulate the flow rate and pressure of a process or imaging gas inside the sample cell 104. Gas output 126 is connected through a leak valve 128 to a roughing pump (not shown). A controlled leak through valve 128 and the relatively small volume of cell 104 compared to the volume of sample chamber 103 provides for rapid switching between different processing gases, for example, to switch between HPSEM beam chemistry mode and HPSEM imaging mode. Particle-optical apparatus 100 can function at relatively high pressure, that is, greater than 20 Torr (26 mbar). Particle-optical apparatus 100 can preferably function at 50 Torr (65 mbar) or higher. Higher pressure provides faster maximum processing rates and the ability to image hydrated materials at room and body temperature. In some embodiments, the pressure in the cell 104 is greater than 10 mTorr, while the pressure in the sample chamber 103 is less than 10 m Torr.

Secondary electron detector 122, which is in the form of a needle, is electrically biased to preferably more than 100 V, more preferably greater than 300 V, and most preferably about 500 volts to attract secondary electrons, which collide with gas molecules between sample 106 and secondary electron detector 122 to create an ionization cascade to amplify the secondary electron signal. The combination of cone 116 with the configuration of secondary electron detector 122, which is positioned outside of the cone, allows for a sufficient secondary electron path within the gas to provide adequate secondary electron signal amplification, while maintaining a short primary electron path through the gas. The secondary electron path from the sample to the detector is preferably greater than 2 mm, more preferably greater than 5 mm and even more preferably greater than 10 mm. An optically transparent window 134 allows a user to observe the sample through an optical microscope (not shown) using a lens 136 positioned between window 134 and sample 106. The optical window 134 allows system 100 to provide a wide field view, while still providing a short gas path length and a low rate of gas leakage into the column, which improves resolution and image signal-to-noise ratio, and protects the column from corrosive gases.

Gas input 124 includes a valve arrangement 140 that allows for rapid switching between multiple gas feeds, such as a one or more process gas feeds 144 and an imaging gas feed 146. A duct 150 allows for evacuation of gases that pass through PLA 114, thereby helping to maintain a lower column pressure above upper PLA 112. A stage 148, which can be the stage from a convention HPSEM or low pressure SEM into which cell 104 is placed, allows the position of cell 104 to be adjusted so that PLA 114 is aligned with the axis of electron beam 110, while stage 108 allows movement of the sample 106 within cell 104 so that a region of interest on the sample 106 can be positioned under the electron beam 110. A seal 152, such as a Viton o-ring or a Teflon seal, preferably provides a gas-tight seal between lens 102 and cell 104 to prevent gases from cell 104 entering sample chamber 103. Seal 152 could also be a non-gas tight seal provided by a small gap that acts as a gas flow restriction between the sub-chamber and sample chamber 103.

The invention is not limited to using a gas cascade detector in the cell. Conventional detectors, such as a gas luminescence detectors or a through-the-lens style detector positioned about the PLA could also be used. In a through-the-lens style detector, voltages are applied to draw the secondary particles back through the final lens, where they can be detected by an on-axis or off axis collection system, such as a multichannel plate or a scintillator photomultiplier. FIG. 1 shows an optional secondary electron deflector 154, such as a Wien filter, that defects secondary electrons away from the primary beam axis and into detector 156, while passing the primary beam 110 without deviation.

Figure 2:
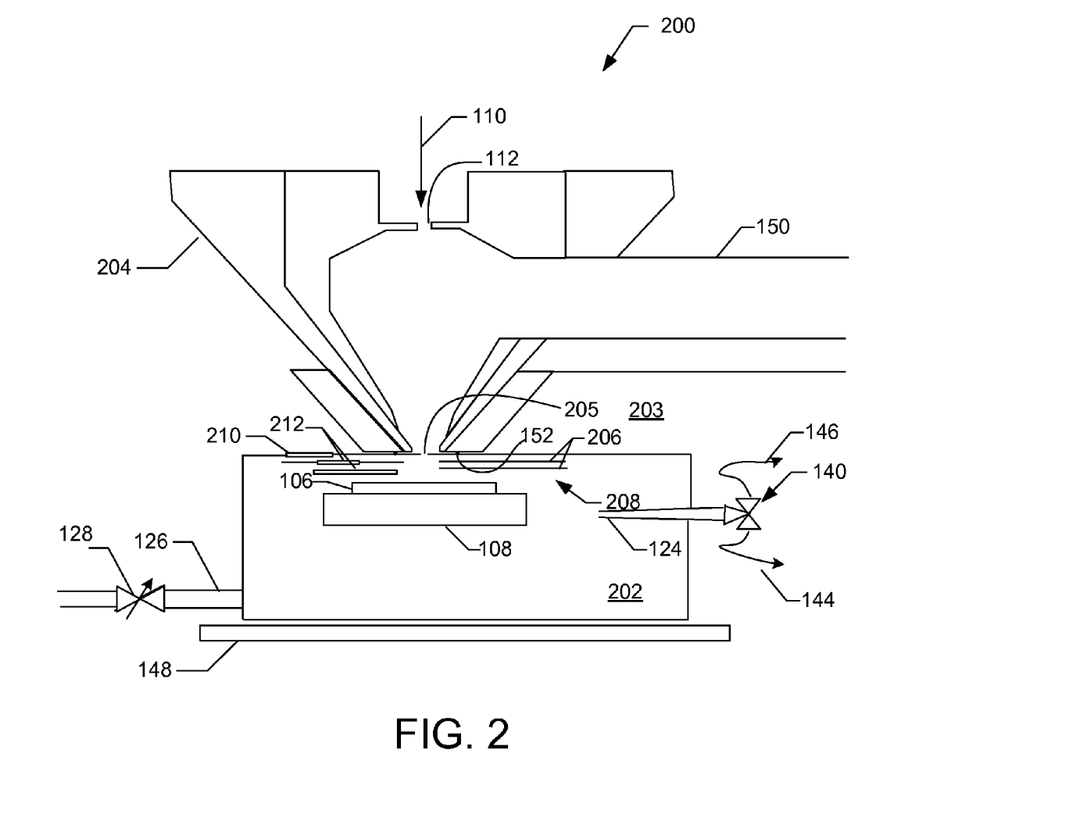
FIG. 2 shows a view of an embodiment of a particle-optical apparatus including a sample cell for use with an immersion lens column.

FIG. 2 shows a cross-sectional view of a particle optical apparatus 200, an HPSEM that is similar to that particle optical apparatus 100 of FIG. 1. System 200 includes a sample cell 202 in a sample chamber 203. Seal 152 formed between sample cell 202 and lens 204 to maintain a higher pressure in cell 202 than in sample chamber 203. Lower PLA 205 maintains the gas pressure in cell 202 at a higher value that the pressure in the interior of lens 204. Upper PLA 112 maintains a lower pressure in the focusing column above the lens. Particle optical apparatus 200 uses an immersion lens 204 and includes one or more plates 206 that comprise a detector 208, such as the one described in U.S. Pat. No. 6,972,412 or U.S. Pat. App. No. 60/787,847, both of which are assigned to the assignee of the present invention and are hereby incorporated by reference. Because such detectors have low efficiencies at high pressures, the embodiment of FIG. 2 performs better at pressure lower than those of the embodiment shown in FIG. 1. The detector 208 preferably uses a combination of electric and magnetic fields to increase the secondary electron path length, thereby providing increased gas signal amplification with a reduced distance between the sample 106 and the detector 208. An optically transparent window 210 in cell 202, together with conductive, transparent portions 212 of detector plates 206 provide a viewing window so that the sample can be observed with an optical microscope (not shown). Conductive, transparent portions 212 can comprise, for example, glass or quartz coated with a transparent conductive coating, such as indium tin oxide. In apparatus 200, as in apparatus 100, a controlled leak through valve 128 and the relatively small volume of cell 202 compared to the volume of sample chamber 203 provides for rapid switching between different processing gases, for example, to switch between HPSEM beam chemistry mode and HPSEM imaging mode.

Figure 3:
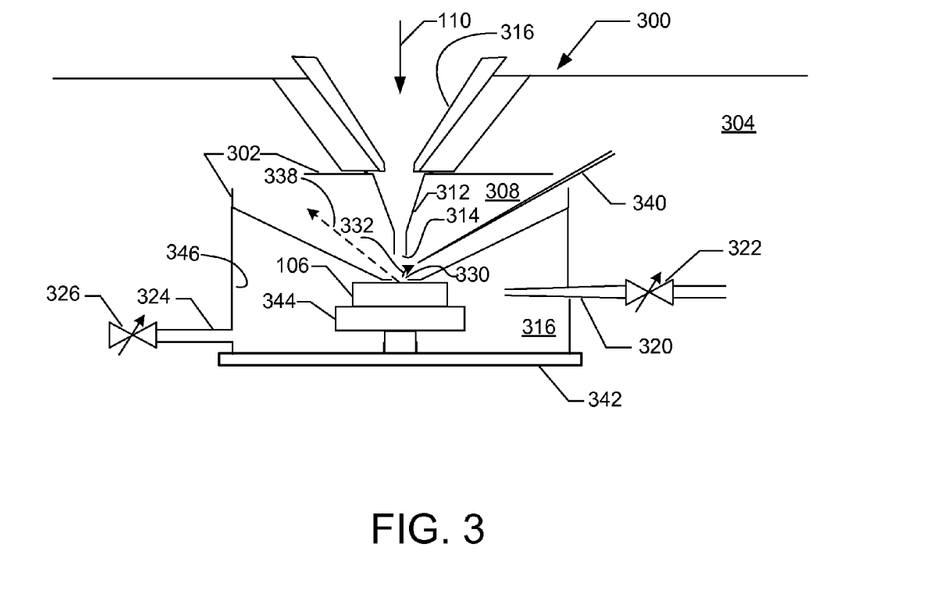
FIG. 3 shows a view of another embodiment of a sample cell for use in the particle-optical apparatus.

FIG. 3 shows a cross-sectional view of a charged particle beam system 300 that includes a housing 302 that fits inside a larger sample chamber 304. Housing 302 includes an interior portion 308 open to sample chamber 304, a cone 312 having at its narrow end an upper PLA 314, and a sample cell 316. The pressure in interior portion 308 during operation is typically the same as the pressure in sample chamber 304. The interior volume and surface area of the sample cell 316 are small relative to the sample chamber 304. System 300 includes a gas inlet 320, an inlet leak valve 322, a gas outlet 324, and an outlet leak valve 326, which can be vented to the sample chamber 304 as shown, or to a roughing pump (not shown). A controlled outlet leak and small sample cell volume allow for rapid switching between HPSEM beam chemistry mode and HPSEM imaging mode. Upper PLA 314 limits gas flow from the interior portion 308 into the focusing column and cone 312 reduces the path length of the primary beam in the high pressure of interior region 308. A lower PLA 330 allows primary beam 110 to impinge on sample 106 in cell 316. The proximity of PLA 330 to sample 106 means that PLA 330 provides a large exit angle at sample 106 to let secondary particles 332 and x-rays 338 emerge from cell 316 to one or more detectors in interior portion 308, sample chamber 304, or elsewhere. PLA 330 preferably has a diameter of 500 micrometers or less and is housed in an optically transparent membrane that permits low magnification optical imaging of the sample.

A secondary electron detector 340 extends into interior portion 308 from sample chamber 304 and terminates at a position above PLA 330. The detector 340 is in the form of a needle and is suitable for use at relatively high pressures. A housing stage 342, such as a conventional SEM sample stage, inside the sample chamber 304 is used for aligning housing 302 so that upper PLA 314 and lower PLA 330 can be aligned with the axis of electron beam 110. A cell sample stage 344 is also included inside the cell 316, for aligning a region of interest on sample 106 under the axis of electron beam 110 for processing. The cell sample stage is preferably thermally isolated from the housing 302 so that the sample temperature can be controlled independently of the cell temperature. This is advantageous, for example, for imaging a sample at body temperature.

The temperature of the cell walls 346 and the sample 106 can preferably be controlled independently. The cell walls 346 can be maintained at a temperature greater than that of the sample 106 to prevent condensation of gas on the interior cell walls 346 and to force sticky molecules to desorb from the walls as quickly as possible. The walls 346 can be heated, for example, by resistive heating coils, by radio frequency energy, or by infrared or ultraviolet radiation through a window in the cell that is transparent to the radiation. Certain radiation, such as ultraviolet radiation may accelerate the molecular desorption rate through mechanisms other than the heating of the sub-chamber. The sample stage 344 can be thermally isolated from the cell 316, so that the temperature of the sample 106 can be controlled independently of the cell walls 346. The pressure in cell 316 during operation is typically greater than the pressure in sample chamber 304.

Inlet valve 322 is preferably a needle valve. Inlet valve 322 and the piping between a gas source (not shown) and cell 316 can preferably be heated to prevent clogging caused by condensation or deposition of precursor molecules having low vapor pressure. For example, in some embodiments, the gas source is a heated source of water vapor, and the heated pipes and valve between the water vapor source and cell 316 prevent condensation of water in the piping and valve. Cell 316 preferably maintains a pressure of 50 Pa or greater, which facilitates high process rates and high quality imaging, although lower pressure may be useful for various applications.

Not all features are shown in each embodiment for clarity of illustration. While the embodiments shown in FIGS. 1-3 include different features, such as the heated cell walls, thermally isolated stage, etc., features from one embodiment, can be incorporated into the other embodiments. In any of the above embodiments, portions of the apparatus that contact the process gases are preferably made from stainless steel or other corrosion-resistant material to prevent damage and eliminate the possibility of venting into the environment.

To ensure process repeatability and the ability to image a sample within a reasonable amount of time after processing the sample without causing further modification during imaging, the time constant, that is, the time for the pressure to be reduced by about 63.2% when evacuating gas from the cell, should be relatively short. In preferred embodiments, the time constant is preferably less than about ten seconds, more preferably between about one and about ten seconds, and most preferably about or less than one second. Such short time constants cannot typically be achieved in prior art HPSEM systems, because the gas exits through a PLA into the column, but the flow rate into the focusing column is intentionally minimized to reduce the pressure in the column. By providing a gas outlet other than through the PLA, the PLA can be made relatively small, for example, less than 500 μm, while the evacuation time constant can be made relatively small.

Figure 4A:
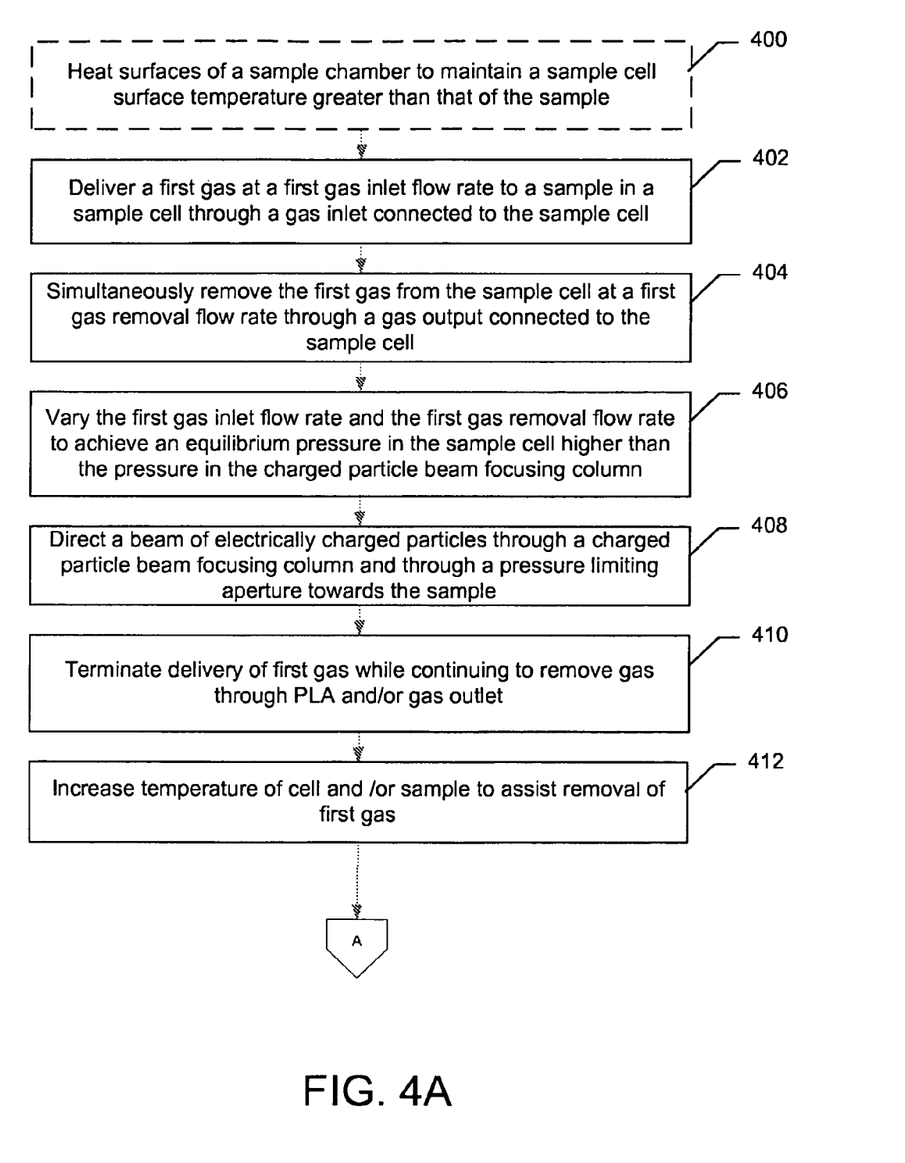
FIGS. 4A and 4B are flow charts showing a method of equilibrating gas pressure in a sample chamber by regulating a gas input and a gas output.

FIGS. 4A and 4B show a method of operating a system in accordance with an embodiment of the invention. Step 400 of FIG. 4A involves heating the interior wall surfaces of a cell to maintain a sample cell surface temperature greater than that of the sample, and optionally heating the sample through a sample stage. A first process gas or a first imaging gas is delivered at a first gas input flow rate through a gas input into the sample cell in step 402. In step 404, the gas is removed from the sample chamber at a first gas removal flow rate. The gas is removed through a gas output connected to the cell, the gas output preferably being an outlet other than through the pressure limiting aperture. The gas may be removed, for example, by a roughing pump connected to the gas output through a leak valve. The equilibrium pressure in the cell is determined by the gas input flow rate, the gas removal flow rate, and the flow rate from the cell into the column through the pressure limiting aperture. For a high vapor pressure gas source, step 404 can begin at the same time as step 402, whereas for a low vapor pressure source, the gas can be permitted to flow into the cell for a period of time before an outlet valve is opened, thereby allowing pressure in the cell to increase more rapidly.

In step 406, the first gas input flow rate and the first gas removal flow rate are varied to achieve a desired equilibrium pressure in the sample cell higher than the pressure in the charged particle beam focusing column. After the system is characterized, the valve positions required to achieve a specific equilibrium pressure may be known, and it may be possible to omit adjustments after the initial setting. Alternatively, the inlet and outlet valves can be computer controlled to produce the desired equilibrium pressure. In step 408, a beam of electrically charged particles, preferably electrons, is directed through the charged particle beam focusing column and through the pressure limiting aperture to process the sample in the cell.

A gas in any stage of processing may comprise multiple gases or multiple species of gas molecules. For example, an electron-beam-induced deposition can use a partial pressure of 3.5 Pa for styrene, and a partial pressure of 22.5 Pa for nitrogen. The gases can be delivered to the specimen chamber simultaneously. Flow rates can be controlled using needle valves. First, the $N_2$ flow control valve is adjusted to achieve a steady state specimen chamber pressure of roughly 22.5 Pa, the pressure needed to stabilize charging of the substrates used. Then, the styrene flow control valve is opened so as to increase the total pressure to roughly 26 Pa.

After one stage of processing is complete, the gas can be changed out for another processing step. In step 410, the gas delivery into the cell is terminated, and gas continues to be removed from the cell through the PLA and/or through the gas outlet. In step 412, the temperature of the interior cell walls, the sample, or both can optionally be increased as the gas is being removed to assist desorption of gas molecules from the interior surfaces of the cell. In optional step 416 of FIG. 4B, a scrubber gas, for example, $N_2$, is supplied through the gas inlet to further assist in purging the remains of the previous gas from the cell. Optionally, the cell interior surfaces are cleaned by a plasma in the cell in step 418, which can rapidly clean the cell and reduce the time required to switch gases. Plasma cleaning is known in the art and is described for example, in U.S. Pat. No. 6,452,315; Proc. SPIE Vol. 4344 (2001), 835; and http://www.evactron.com.

Figure 4B:
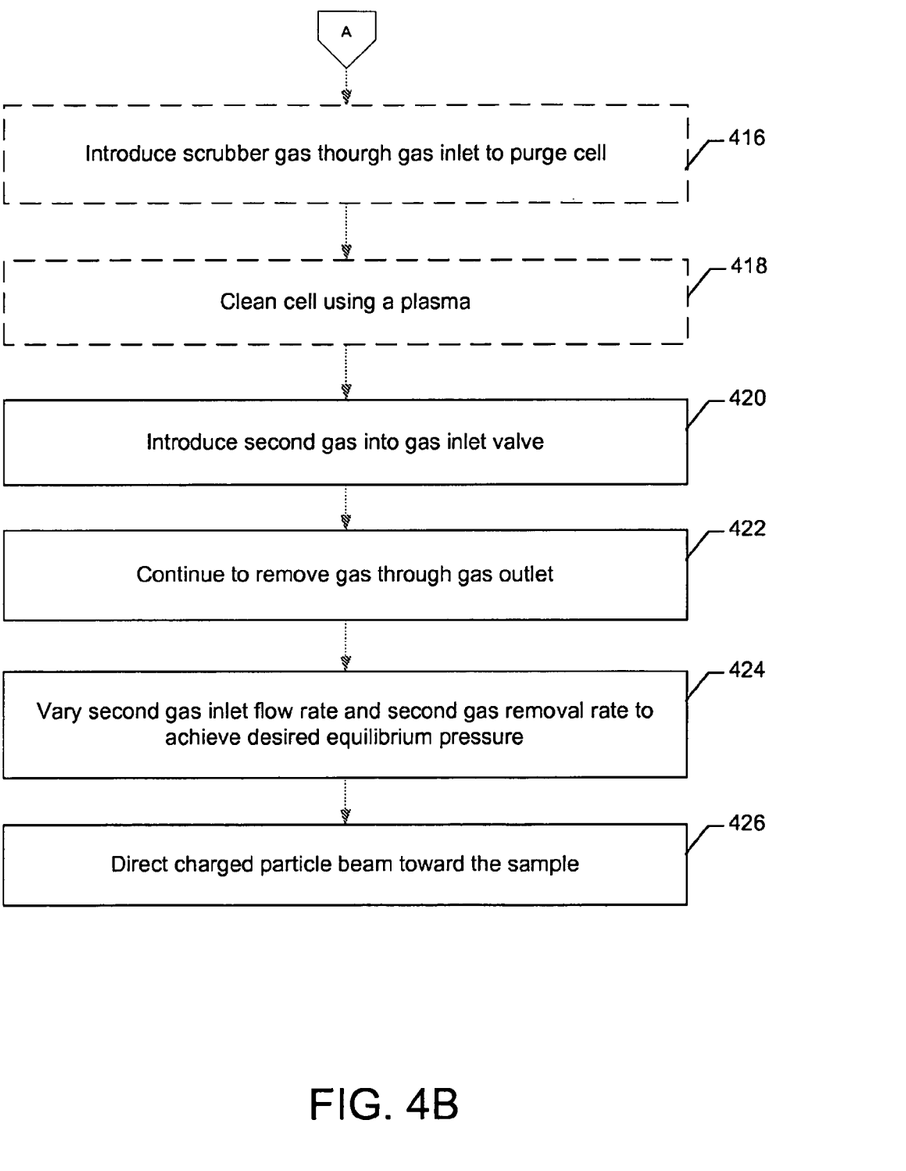

In step 420, a second gas is introduced into the gas inlet valve. In step 422, gas continues to be removed from the sample cell at the first gas removal flow rate. Having switched from the first gas to the second gas in step 420, step 424 involves varying the second gas input flow rate and the second gas removal rate to achieve an equilibrium pressure of the second gas in the sample cell at a pressure higher than the pressure in the charged particle beam focusing column. In step 426, a charged particle beam is directed toward the sample. For example, the gas injected into the cell in step 402 may be a precursor gas, and step 408 may entail depositing or etching a sample through the interaction of the precursor gas and the electron beam. Step 420 may entail delivering an imaging gas, such as nitrogen or water vapor, and step 426 may entail using the beam to form an image of the sample.

The order and inclusion of the various steps described above will vary with the gases used. For example, stickier molecules may require longer purge times, along with cell wall heating, scrubber gases, or plasma cleaning operations. Relatively inactive gases, such as some imaging gases, may require neither cell heating nor purge gases.

The invention can also be used for delocalized processing, that is, etching or depositing that is not induced by the charged particle beam and is not limited to an area adjacent the beam impact point. Setting the sample temperature above that needed for thermal decomposition of a precursor will give rise to deposition or etching of the sample. This can be useful, for example, as one step in a multi-step process, thereby allowing more complete processing in a single vacuum chamber. Processing in a single vacuum chamber eliminates the inefficiencies inherent in multiple venting and evacuating steps, along with the contamination that is introduced when a sample leaves a vacuum chamber.

Figure 5:
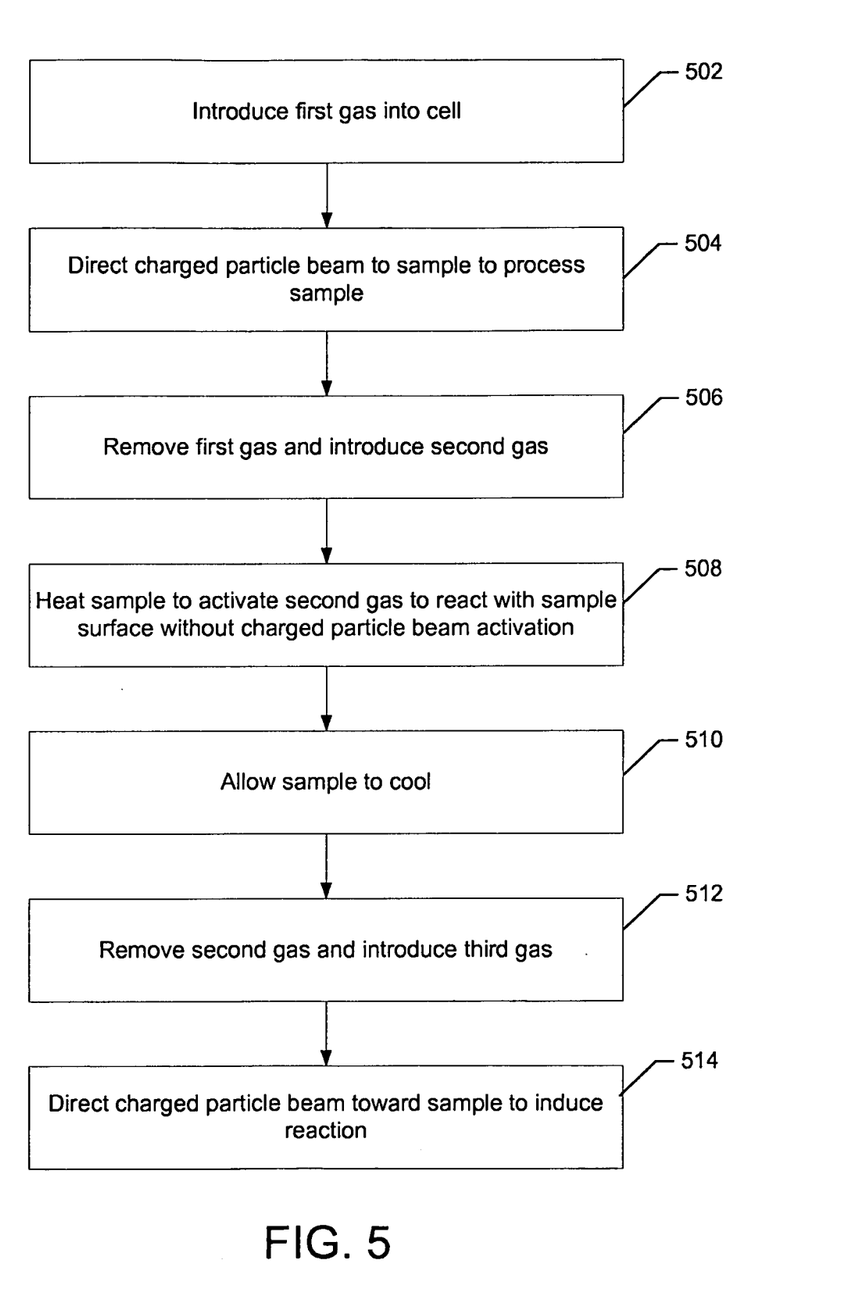
FIG. 5 is a flow chart showing a process that includes non-localized processing.

For example, FIG. 5 shows introducing a first gas into a cell in step 502. For clarity, FIG. 5 does not show the operational detail that is already shown in FIG. 4 for introducing and switching gases. In step 504, a charged particle beam is directed to process the sample. For example, the first gas introduced in step 502 could be a deposition precursor gas and in step 504, an electron beam or ion beam could be directed to the sample to decompose the precursor gas to deposit a material in a precise pattern, at points to which the charged particle beam is directed.

In step 506, the first gas is removed while a second gas is introduced. The second gas could be, for example, another deposition precursor gas or an etch precursor gas. In step 508, the sample is heated to a temperature at which sufficient energy is provided at the sample surface to activate the second gas. For example, the second gas can be a deposition precursor gas, which is activated to deposit a coating onto the sample surface. Because the sample surface temperature provides the activation energy to decompose the precursor gas, the coating is applied across the sample surface. The second gas could also be an etchant gas that etches the sample surface. For example, the second gas could selectively etch the sample surface material at a higher rate than it etches the material deposited in step 504, so that the material deposited in step 504 acts as an etchant mask over the surface. The sample is then etched only where no material was deposited in step 604.

In step 510, the sample is allowed to cool to a temperature at which the surface does not provide sufficient energy to activate gas in the chamber. The sample can be cooled by convection by a gas flowing through the cell, by conduction through the sample stage, which may optionally include a refrigeration unit to cool the sample, or by radiation. In step 512, the second gas is removed and a third gas is introduced. The second gas can be removed and the third gas introduced simultaneously with cooling the sample. In step 514, a charged particle beam is directed to the sample surface to induce a reaction with the third gas. For example, the third gas can be an etch precursor gas that etches a pattern in a covering layer that was deposited in step 508, or the third gas can be a deposition precursor gas that deposits, in conjunction with the charged particle beam, a patterned material.

Figure 6:
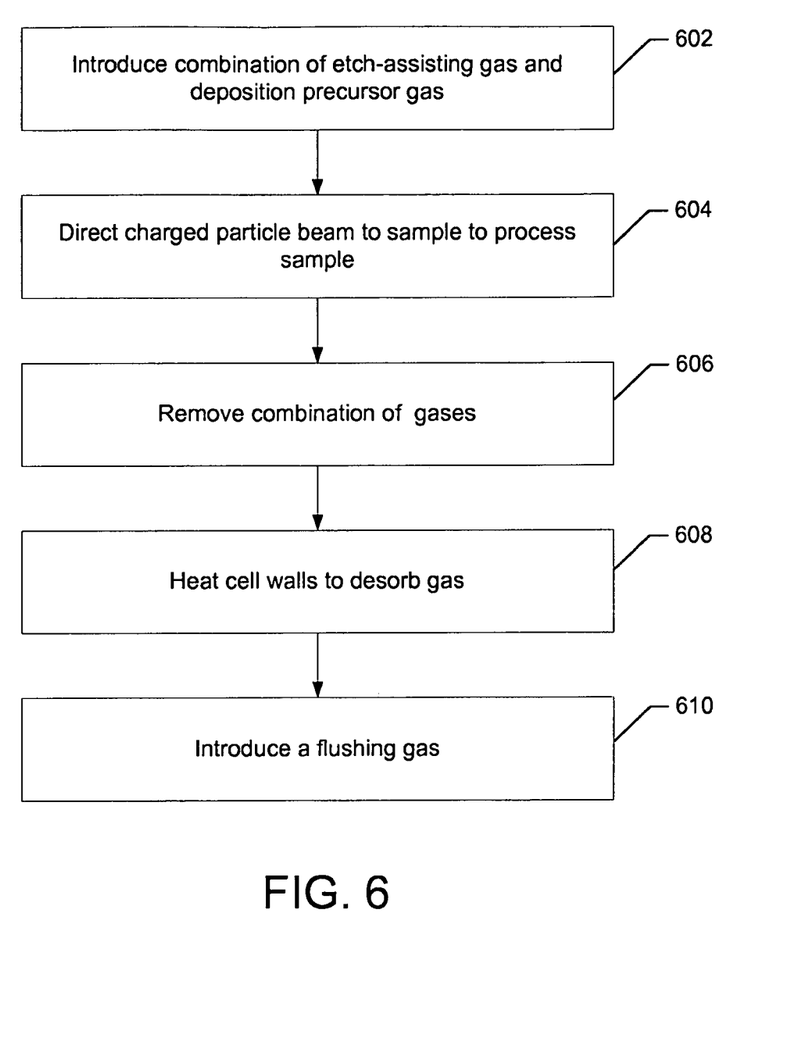
FIG. 6 is a flow chart showing a process that includes a mixture of deposition precursor and etch precursor gases.

The invention may also provide a useful means of eliminating unintentional delocalized deposition that occurs during conventional electron beam-induced deposition, and particularly during HPSEM electron beam-induced deposition. For example, one could reduce or eliminate unintentional delocalized deposition by using a gas mixture containing both an etch precursor gas and a deposition precursor and by selecting an etch precursor that: (i) has a dissociation energy that is lower than that of the deposition precursor, and that (ii) gives rise to chemical etching of the electron beam-induced deposition deposit, but not the substrate. FIG. 6 shows an example of a procedure.

In step 602, a gas containing a mixture of an etch precursor gas and a deposition precursor gas is introduced into a cell. For example, a preferred etch precursor gas has a dissociation energy that is lower than that of the deposition precursor and selectively etches the electron beam-induced deposition deposit, but not the substrate. As described above, a desired partial pressure of each of the gases is maintained by introducing the gases through one or more gas inlets while removing gas through one or gas outlets, one of the outlets preferably being other than through the PLA and into the focusing column.

In step 604, a charged particle beam is directed to the sample in the environment of the gas mixture. In step 606, the combination of gases is removed from the cell through the gas outlet. In step 608, the cell walls are heated to desorb any precursor gases that are adsorbed onto the cell walls, and in step 610, a flushing gas is introduced to assist in flushing remnants of the precursor gases from the chamber. In some embodiments, a plasma can be used to rapidly remove any precursor gas molecules adsorbed to the cell walls.

Deposition and etch precursor that are effective for selectively etching or depositing various materials in the presence of a charged particle beam are well known. Precursor gas molecules typically fall into one or more of the following groups: organics, metalorganics, organometallics, organohalides, aromatics, amines, phosphines, halides, chlorides, fluorides, metal halides, metal chlorides, metal fluorides, metal hydrides, silanes and organosilanes. For example, many halogens or halogen compound, such as iodine, chlorine, and xenon difluoride are used known for etching in the presence of a charged particle beam. Similarly, many deposition precursors are known and include, for example, metal precursors, such as, metaloorganic compounds such as tungsten hexacarbonyl, and methylcyclopentadienyl trimethyl platinum. Insulation precursors can include TEOS and TMOS. Imaging gases can include $N_2$, $H_2O$, $N_2O$ and Ar.

Embodiments of the invention are also suitable for applications in which the beam is used to observe, relatively passively, gas-sample reactions. Examples include thermal decomposition of deposition precursors, as in chemical vapor deposition (CVD) and metalorganic chemical vapor deposition (MOCVD), and catalysis processes in which the reactions are initiated by heat.

Although the present invention and its advantages have been described in detail, it should be understood that various changes, substitutions and alterations can be made herein without departing from the spirit and scope of the invention as defined by the appended claims. For example, in some systems a small environmental may be used in place of a larger sample chamber, rather than placing the environmental chamber as a cell inside of a main sample chamber. The charged particle beam may be an ion beam, as well as an electron beam. A laser, such as femto-second laser could also be used with the present invention. Any process gas that can be used with a charged particle beam or laser can be used with the invention, including halogen compounds, such as xenon difluoride and organometallic compounds, such as tungsten hexacarbonyl. Applicants have found that the purity of electron-beam induced depositions are improved over prior art electron beam induced depositions.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A particle-optical apparatus comprising:
   a sample chamber;
   a charged particle source;
   a charged particle beam focusing column for directing charged particles from the charged particle source toward the sample;
   a sample cell within the sample chamber for receiving a sample, the cell sufficiently enclosed to maintain a gas pressure different from that in the sample chamber;
   a gas inlet connecting the sample cell to a source of an etch precursor gas or a deposition precursor gas;
   at least one pressure limiting aperture, directly coupling the sample cell to the charged particle beam focusing column, for maintaining a lower pressure in the charged particle beam column than at the sample;
   a gas outlet connecting the sample cell to a pump for evacuating the sample cell, the gas outlet being separate from the gas inlet, the gas outlet being other than through the pressure limiting aperture and the focusing column;
   a first stage for moving the sample cell and aligning the sample cell with the at least one pressure limiting aperture;
   a second stage positioned within the sample cell for moving the sample and aligning the sample with the charged particle beam; and
   a detector positioned apart from the first and second stages for detecting electrons emitted from the sample, the electrons emitted from the sample comprising an electron current, the electron current being amplified by a gas ionization cascade to produce an amplified imaging signal for forming an image of the sample.

2. The particle-optical apparatus of claim 1, in which the gas inlet comprises a gas inlet connecting the sample cell to a source of molecules other than $H_2O$, $N_2$ or air.

3. The particle-optical apparatus of claim 1, in which the gas inlet connecting the sample cell to a source of gas includes a gas inlet connecting the sample cell to a source of gas molecules comprising organics, metalorganics, organometallics, organohalides, aromatics, amines, or organosilanes.

4. The particle-optical apparatus of claim 1, in which the gas inlet connecting the sample cell to a source of gas includes a gas inlet connecting the sample cell to a source of gas molecules comprising phosphines, halides, chlorides, fluorides, metal halides, metal chlorides, metal fluorides, metal hydrides, or silanes.

5. The particle-optical apparatus of claim 1, in which the sample cell pressure is greater than 10 mTorr.

6. The particle-optical apparatus of claim 5, in which the sample chamber pressure is lower than 10 mTorr.

7. A particle optical apparatus, comprising:
   a sample chamber;
   a charged particle source;
   a charged particle beam focusing column for directing charged particles from the charged particle source toward the sample, the focusing column including an objective lens for focusing the charged particle beam onto the sample surface;
   a sample cell within the sample chamber for receiving a sample, the sample cell being sealed against the objective lens and being sufficiently enclosed to maintain a gas pressure different from that in the sample chamber outside the sample cell;
   a gas inlet connecting the sample cell to a source of a deposition precursor gas or an etch precursor gas;
   a gas outlet from the sample cell directly connecting the sample cell to a pump for evacuating the sample cell, the gas outlet being separate from the gas inlet, the gas outlet being other than through the pressure limiting aperture and the focusing column;
   a first stage for moving the sample cell and aligning the sample cell with the at least one pressure limiting aperture;
   a second stage positioned within the sample cell for moving the sample and aligning the sample with the charged particle beam;
   a first pressure limiting aperture positioned between the sample cell and the charged particle beam focusing column so that most of the gas escaping from the sample cell through the pressure limiting aperture enters the charged particle beam focusing column;

an outlet for exhausting gas from the charged particle beam column above the first pressure limiting aperture;

a second pressure limiting aperture positioned above the exhaust outlet.

8. The particle-optical apparatus of claim 1, in which the gas inlet includes multiple gas inlets for introducing gas into the cell.

9. The particle-optical apparatus of claim 1, in which the sample cell comprises corrosion-resistant material.

10. The particle-optical apparatus of claim 1, in which the gas inlet connecting the sample cell to a source of a gas includes a gas inlet connecting the sample cell to a source of a gas that, when activated by the charged particle beam, etches material from or deposits material onto, a sample in the sample cell to form an element in a microscopic structure.

11. The particle-optical apparatus of claim 7, further comprising a movable cell stage inside the sample chamber for aligning the cell with a primary beam axis.

12. The particle-optical apparatus of claim 1 including a thermally isolated sample stage for holding the sample within the sample cell.

13. The particle-optical apparatus of claim 1, further comprising a heater for heating the sample.

14. The particle-optical apparatus of claim 1, further comprising a source of energy for heating the cell walls.

15. The particle-optical apparatus of claim 1, in which the sample cell includes an optically transparent window for viewing the sample.

16. The particle-optical apparatus of claim 1, in which the detector comprises an electrode that detects an electrical signal induced by the flow of charge in the gas cascade.

17. The particle-optical apparatus of claim 1, in which the charged particle beam column includes a magnetic lens, the magnetic lens producing a magnetic field that extends the path of electrons in the gas to produce additional collision.

18. The particle-optical apparatus of claim 1, in which the detector includes an electrode positioned at least 3 mm from the sample to amplify the electron current.

\* \* \* \* \*